(12) United States Patent
Hüttl et al.

(10) Patent No.: US 8,663,438 B2
(45) Date of Patent: Mar. 4, 2014

(54) TARGET ARRANGEMENT

(75) Inventors: Grit Hüttl, Freiberg (DE); Folke Steinert, Freiberg (DE); Joachim Wagner, Freiberg (DE)

(73) Assignee: GFE Fremat GmbH (DE)

( * ) Notice: Subject to any disclaimer, the term of this patent is extended or adjusted under 35 U.S.C. 154(b) by 911 days.

(21) Appl. No.: 12/281,310

(22) PCT Filed: Feb. 14, 2007

(86) PCT No.: PCT/EP2007/001295
§ 371 (c)(1),
(2), (4) Date: Dec. 2, 2008

(87) PCT Pub. No.: WO2007/098858
PCT Pub. Date: Sep. 7, 2007

(65) Prior Publication Data
US 2009/0152108 A1    Jun. 18, 2009

(30) Foreign Application Priority Data
Mar. 2, 2006 (DE) .......................... 10 2006 009 749

(51) Int. Cl.
*C23C 14/35* (2006.01)
*B23K 5/22* (2006.01)

(52) U.S. Cl.
USPC ............ 204/298.12; 204/298.13; 204/298.21; 204/298.22; 228/106; 228/122.1; 228/135; 228/175; 228/212; 228/245; 228/246; 228/258

(58) Field of Classification Search
USPC ............ 204/298.12, 298.13, 298.21, 298.22; 228/106, 122.1, 135, 175, 212, 245, 228/246, 258
See application file for complete search history.

(56) References Cited

U.S. PATENT DOCUMENTS

| | | | |
|---|---|---|---|
| 4,820,397 A | 4/1989 | Fielder | |
| 5,147,521 A | 9/1992 | Belli | |
| 5,531,867 A | 7/1996 | Crooker | |
| 5,653,856 A | 8/1997 | Ivanov | |
| 7,811,429 B2 * | 10/2010 | Landgraf et al. ........ | 204/298.12 |
| 2006/0065524 A1 | 3/2006 | Newcomb | |
| 2007/0074969 A1 * | 4/2007 | Simpson et al. .......... | 204/192.1 |

FOREIGN PATENT DOCUMENTS

| | | |
|---|---|---|
| DE | 44 14 470 A1 | 11/1995 |
| DE | 102 31 203 A1 | 2/2004 |
| DE | 102 52 577 A1 | 5/2004 |
| DE | 10 2004 031 161 A1 | 1/2005 |
| DE | 10 2005 020250 A1 | 11/2006 |
| EP | 0 336 618 A2 | 10/1989 |
| EP | 1 561 836 A | 8/2005 |

(Continued)

OTHER PUBLICATIONS

Machine Translation of EP 1 561 836 A1 dated Aug. 10, 2005.*

*Primary Examiner* — Rodney McDonald
(74) *Attorney, Agent, or Firm* — Kilpatrick Townsend & Stockton LLP

(57) ABSTRACT

The invention relates to a target arrangement comprising a tubular-shaped carrier element and a hollow-cylindrical target having at least one target material, said target comprising at least one one-piece tube segment which at least partially surrounds the carrier element. Said carrier element and the tube segment are partially interconnected in a material fit by at least two plastically deformable compensating means. The invention also relates to a method for producing said type of target arrangement and a tubular segment.

22 Claims, 3 Drawing Sheets

(56) References Cited

FOREIGN PATENT DOCUMENTS

Figure 1:
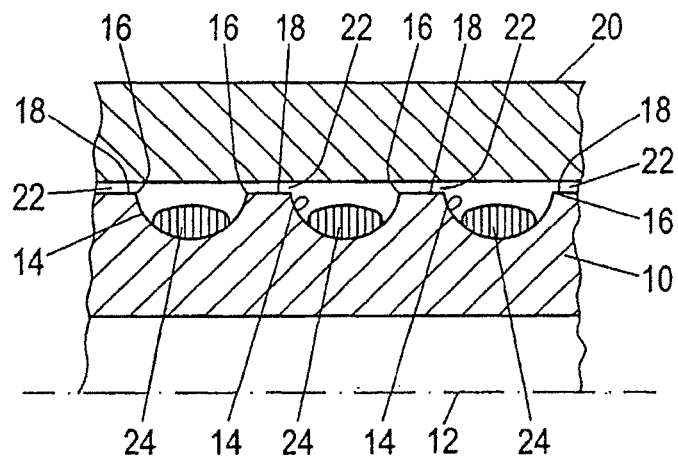

| | | |
|---|---|---|
| JP | 63 270460 A | 11/1988 |
| JP | 08 060351 A | 3/1996 |
| KR | 1020060029124 A | 4/2006 |
| WO | WO 02/20866 A1 | 3/2002 |
| WO | WO 2004/007791 A1 * | 1/2004 |
| WO | WO 2006/063721 A | 6/2006 |

* cited by examiner

TARGET ARRANGEMENT

CROSS-REFERENCE TO RELATED APPLICATIONS

This application is a National Stage of International Application No. PCT/EP2007/001295, filed Feb. 14, 2007, and which claims the benefit of German Patent Application No. 10 2006 009 749.1, filed Mar. 2, 2006, the disclosures of both applications being incorporated herein by reference.

The invention relates to a target arrangement comprising a tubular carrier member and a hollow cylindrical target comprising at least one target material and including at least one tube segment made in one piece and surrounding the carrier member at least section-wise.

Target arrangements of this type, which are also called atomization targets or sputter targets, are generally known. They are used as a material source, for example in the thin coating of large-area substrates by means of cathode atomization or sputtering. The thin coating by means of such target arrangements is used, for example, for the manufacture of heat protection films or sun protection films on flat glass or plastic foils.

The fastening of the target to the carrier member is problematic with target arrangements of the initially named kind. This in particular applies to those target arrangements in which the target is not applied directly to the carrier member by a casting process or by a thermal injection molding process, for example because the target material would sublimate on casting or thermal injection.

Target arrangements are thus known in which the target is fastened to the carrier member in a force-transmitting manner with the help of elastic clamping elements. However, only a moderate thermal dissipation between the target and the carrier member is achieved by means of such a force-transmitting connection.

An improved thermal dissipation could be achieved by a full-area connection with material continuity between the target and the carrier member. Full-area, connections with material continuity of this type are used, for example, in planar targets in which a planar target segment is fastened to a support plate by means of a throughgoing solder layer. A semi-cylindrical target segment can accordingly be attached to a tubular carrier member in this manner.

Full-area, solder connections with material continuity are, however, not suitable for target arrangements in which the target is made of at least one tube segment. Since the carrier members of tubular target arrangements, for example, comprise a metal material and the target tube segments comprise a ceramic material, the carrier members and the tube segments have thermal coefficients of expansion which differ significantly from one another. There is not only the risk of a loosening of the connection between the carrier member and the tube segment due to the resulting difference in the thermal expansion of the carrier member and the tube segment and due to the brittleness of the ceramic material, but also the risk of damage to the tube segments.

To compensate the different coefficients of expansion between the metallic material and the ceramic material, an adhesive bonding of the carrier member and the tube segment by means of a plastically deformable adhesive had also been considered. Apart from the fact that an adhesive of this type does not have sufficiently high heat conduction properties, a reliable adhesive bonding of two joint partners moreover requires a certain pressure on the joint partners. An adhesive bonding of the carrier member and the target segment may therefore be considered for target arrangements having planar or semi-cylindrical target segments. However, due to the stiffness of both the tube segment and the carrier member and owing to the coaxial arrangement of the carrier member and the tube segment, an adhesive introduced between the carrier member and the tube segment cannot be acted on viewed in the radial direction. An adhesive bonding of the carrier member and the target segment can therefore hardly be realized in practice with target arrangements having tubular target segments.

It is the underlying object of the invention to provide a target arrangement of the initially named kind in which the carrier member and the target are connected to one another in a simple and reliable manner and simultaneously an improved heat transfer is ensured between the target and the carrier member.

The object is satisfied in accordance with the invention by a target arrangement having the features of claim 1 and in particular in that the carrier member and each tubular segment are partially connected to one another with material continuity by at least two plastically deformable compensation means.

Since the carrier member and the tube segment or the tube segments of the target are not in direct contact with one another in accordance with the invention, but are connected to one another by plastically deformable compensation means, the joint partners, i.e. the carrier member and the target, can expand to different degrees in the event of heating, for example during a sputtering process, in accordance with their different thermal coefficients of expansion without strains being caused in the target material which could result in damage to the target, e.g. in cracks in the target material. Different thermal expansions of the carrier member and the target are so-to-say compensated or balanced by the plastically deformable compensation means.

At the same time, a heat transfer between the target and the carrier member which is improved in comparison with force-transmitting joint variants is achieved by the connection with material continuity of the compensation means both to the target and to the carrier member. The heat introduced into the target during a sputtering process can thus be dissipated to the carrier member up to ten times better via the connection with material continuity than by a force-transmitting connection.

This permits a use of the target arrangement in so-called heavy-duty sputtering processes, i.e. that is a use of the target arrangement in sputtering with increased power densities and in particular increased voltages. Furthermore, the connection with material continuity also permits an increased target utilization of up to 80% since there is no risk of parts of the target being able to enter the sputtering plant on too low a residual density due to a failure caused thereby. Both ultimately result in an improved economy of the respective sputtering process.

The expression "partially connected to one another" is to be understood here such that the carrier member and the tube segment are not connected to one another over the full-area, but rather only regionally. A gap located between the tube segment and the carrier member is therefore not completely filled by the compensation means. It is rather the case that the compensation means establish a partial connection between the carrier member and the target, i.e. they form locally limited bridges separate from one another between the joint partners. The deformability of the compensation means is thereby substantially increased and the different thermal expansion of the target and the carrier member can be particularly effectively compensated.

Advantageous embodiments of the invention can be seen from the dependent claims, from the description and from the drawing.

In accordance with a preferred embodiment, the compensation means are free of flux. The target arrangement is thereby particularly well-suited for use in a vacuum plant in which there is generally a risk of an evaporation of volatile substances such as fluxes.

It is particularly advantageous when the compensation means include a solder, and in particular a soft solder. Solder not only has a particularly high thermal conductivity, but is also very easily plastically deformable. Furthermore, a Sn solder, for example, has a thermal coefficient of expansion of approximately $24 \cdot 10^{-6}\,K^{-1}$, whereas ZnO has a thermal coefficient of expansion of approximately $5.3 \cdot 10^{-6}\,K^{-1}$ and stainless steel has a thermal coefficient of expansion of approximately $16 \cdot 10^{-6}\,K^{-1}$. Compensation means comprising Sn solder can consequently particularly effectively compensate the different thermal expansions of a ZnO target and a stainless steel carrier member. Furthermore, solder can be processed particularly easily, whereby the manufacture of the target arrangement is simplified overall.

Furthermore, solder can be liquefied again under a corresponding supply of heat, whereby it is possible to separate the connection between the joint partners and to release the target from the carrier member. A damaged tube segment can thus be replaced by an undamaged tube segment in a simple manner. The separation of the target and the carrier member moreover permits a reuse of the carrier member after the target material has been used up in a sputtering process or in a plurality of sputtering processes.

In accordance with a preferred embodiment, regions of a gap provided between the target and the carrier member and spaced apart from one another are filled up with solder. The compensation means are, in this case, therefore formed by locally limited solder bridges which are separate from one another and which partially connect the target and the carrier member to one another. The solder bridges have a particularly good deformability, whereby thermally induced strains between the target and the carrier member can be compensated even better.

It is particularly advantageous for the solder to be provided between the target and projections of the carrier member. Regions are pre-set by the projections in which the solder connects the joint partners to one another.

The projections are preferably spaced apart from one another, viewed in the axial or radial direction, and are then in particular arranged distributed over substantially the whole length of the target. On the one hand, different thermal expansions of the joint partners in the axial direction can thereby be compensated particularly easily. On the other hand, a thermal coupling of the target to the carrier member can be ensured over the total length of the target.

The projections advantageously include webs substantially extending in the peripheral direction of the carrier member. Projections of this type can be manufactured particularly simply, for example by a corresponding introduction, e.g. milling or cutting, of elongate cut-outs or grooves into the carrier member.

In accordance with an embodiment, a plurality of web-like projections extend at right angles to the longitudinal axis of the carrier member. The projections preferably extend in a ring-like manner over the whole periphery of the carrier member. Alternatively or additionally, a web-like projection can extend around the carrier member in spiral form. A projection of this type can be formed, for example, in that a spiral cut-out is cut into the carrier member in the manner of a threaded groove. Both the ring-like projections and the spiral projections permit the manufacture of target arrangements of any desired length in a simple manner.

The cut-outs of the carrier member bounded by the projections advantageously form a receiving space for the solder in a pre-assembly state of the target arrangement. On the assembly of the target arrangement, the solder therefore does not have to be applied directly to the projections, but can rather be arranged in the cut-outs, for example in the form of half-stock. The cut-outs thus so-to-say form a reservoir for the solder. The manufacture of the target arrangement is thereby simplified even further.

Fixing means are preferably arranged between the tube segment and the carrier member to fix, and in particular to center, the target with respect to the carrier member in a pre-assembly state. Even before the target and the carrier member are connected to one another with material continuity by the solder, a correct positioning of the joint partners relative to one another is ensured by the fixing means. This, on the one hand, facilitates the manufacture of the target arrangement and, on the other hand, ensures a correct seat of the target on the carrier member.

Alternatively, the target can also be centered with respect to the carrier member without fixing means while utilizing the different heat expansions of the target and the carrier member.

In accordance with a further embodiment, the compensation means each include a spring member. The connection of the carrier member and the target therefore does not take place via solder bridges in this joint variant, but via spring members connected with material continuity to the carrier member and the target. This joint variant combines the advantages of a force-transmitting connection with those of a connection with material continuity. A particularly good compensation is thus achieved between the different coefficients of expansion of the carrier member and the target by the elasticity of the spring members and a particularly efficient thermal dissipation from the target to the carrier member is achieved by the connection with material continuity of the spring members both to the carrier member and to the target.

Advantageously, each spring member is connected to the carrier member and to the tube segment with material continuity by means of a solder, in particular a soft solder. As has already been mentioned above, solder has particularly good thermal dissipation properties so that the thermal coupling of the target to the carrier member is improved even further.

Cut-outs for the spring members can be provided on the outer side of the carrier member. The spring members are already fixed to the carrier member in a pre-assembly state through the cut-outs and are in particular secured against an axial displacement with respect to the carrier member. This facilitates the pushing of the tube segment or of the tube segments onto the carrier member.

In accordance with a further embodiment, the target is metallized, in particular over the full area, at its inner side and/or the carrier member is metallized, in particular over the full area, at its outer side. A metallization of this type ensures a particularly reliable connection with material continuity between the joint partners, in particular when a soft solder free of flux is used as the compensation means or as the connection means for the connection of spring members to the target and to the carrier member and when the target comprises a ceramic material such as ZnO. The target can be coated, for example electroplated, at its inner side and the carrier member can have solder applied at its outer side.

To prevent melted solder from penetrating to the outer side of the target on the manufacture of the connection with material continuity of the target and the carrier member, a respective sealing material, in particular a heat-resistant sealing material, e.g. a silicone material, can be provided between two adjacent tube segments.

A further subject of the invention is moreover a method having the features of claim 17. The aforesaid advantages are achieved accordingly by the method in accordance with the invention.

In accordance with an embodiment of the method in accordance with the invention, the carrier member and the tube segment are connected to one another by means of a solder, in particular of a soft solder, and preferably by means of a soft solder free of flux.

The solder is preferably arranged between projections of the carrier member spaced apart from one another and in particular formed in the manner of webs in a pre-assembly state of the target arrangement. This represents a particularly simple method for the application of the solder to the carrier member. The solder can, for example, be inserted into the cut-outs formed between the projections as half-stock.

The solder must be liquefied so that it can establish a connection with material continuity between the carrier member and the target. It is particularly advantageous in this connection for the target and the carrier member to be rotated such that the liquefied solder moves under the effect of centrifugal forces and capillary forces into gaps formed between the target and the projections of the carrier member to contact the target and the carrier member.

The liquefied solder therefore moves out of a pre-assembly position into an end position by the rotation of the target and the carrier member, namely out of the cut-outs into the gaps formed between the projections and the target. As soon as so much solder has moved onto the projections that the gaps between the projections and the target are completely filled with solder, the heat input and the rotation of the target arrangement can be ended so that the solder can cool and can connect with material continuity both to the target and to the projections of the carrier member.

Since the solder moves into the gaps between the projections and the target due to the centrifugal forces and the capillary forces, a correct positioning of the solder in the regions provided for the connection with material continuity of the target and the carrier member is automatically achieved. This simplifies the manufacture of the target arrangement and permits the manufacture of target arrangements of any desired length. In this connection, it is not necessary to melt the solder or to let it solidify simultaneously over the whole length of the target arrangement, but the target arrangement can rather be moved through a correspondingly made heat source, e.g. a continuous furnace, for the liquefying of the solder.

In accordance with a further embodiment of the method in accordance with the invention, each compensation means includes a spring member which is connected by solder to the carrier member and to the tube segment. It is possible by a corresponding heat input to melt the solder located between the spring members and the carrier member and the solder located between the spring members and the target simultaneously to establish the connection with material continuity of the spring members to the carrier member and to the target simultaneously.

Alternatively or additionally, the spring members can also already be connected with material continuity to the carrier member before the pushing of the tube segments onto the carrier member. In this way, the spring members are fixed to the carrier member and cannot be displaced in an axial direction on the pushing of the tube segments onto the carrier member. The same effect can alternatively or additionally be achieved in that receivers for the spring members are provided in the carrier member.

In order to improve the adhesion of the solder to the target and to the carrier element—as was already described above—the tube segment can be metallized, in particular over the full area, at its inner side and/or the carrier member can be metallized, in particular over the full area, at its outer side before the application of the solder.

A further object of the invention is moreover a tube segment of a hollow cylindrical target which comprises a ceramic material and a metal coating, in particular over the full area, at the inner side of the tube segment. The coating can e.g. include a layer comprising Ni, a layer comprising Cu and a layer comprising SnPb. The Ni layer has a particular good adhesion strength to a ceramic material comprising ZnO, whereas the Cu layer protects the Ni layer from corrosion and reduces the porosity of the SnPb layer. The Cu layer can optionally also be omitted. The SnPb layer is the actual functional layer which provides an optimum adhesion of a solder free of flux to the tube segment.

The ceramic material of the tube segment can comprise ITO (indium tin oxide).

Figure 2:
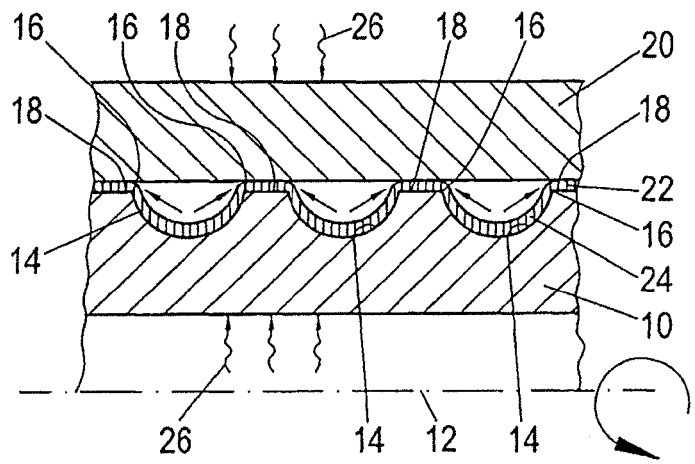
Figure 3:
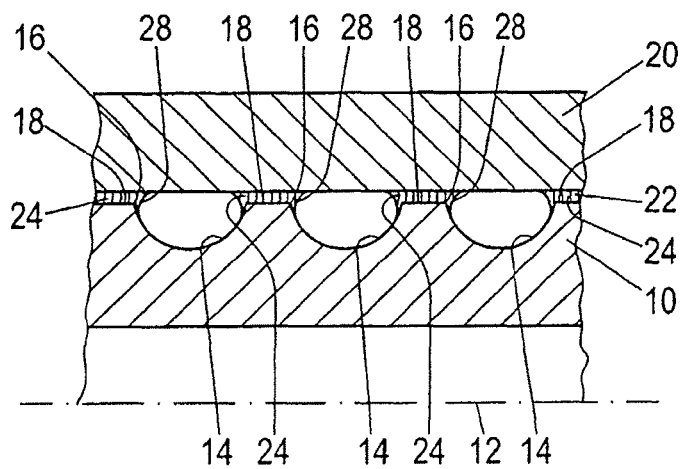
Figure 4:
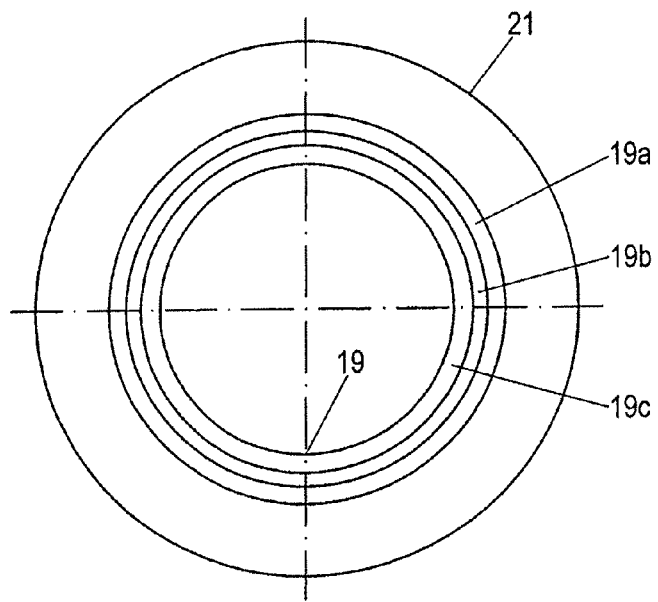
Figure 5:
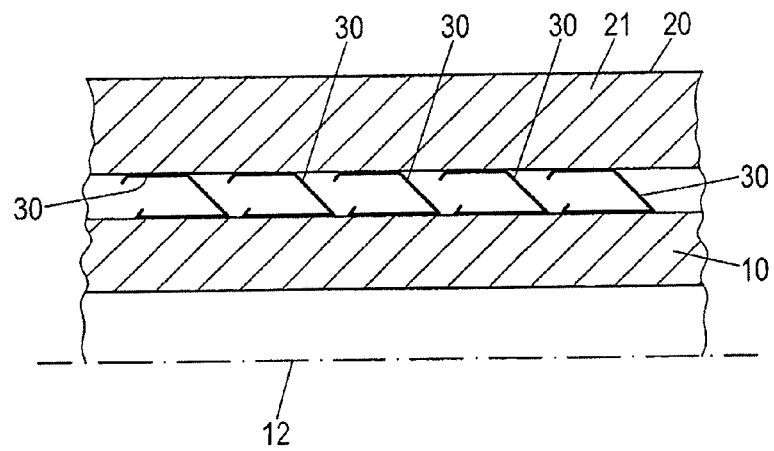

The invention will be described in the following purely by way of example with reference to advantageous embodiments and to the drawing. There are shown:

FIG. 1 a longitudinal section through a first embodiment of a target arrangement in accordance with the invention in a pre-assembly state;

FIG. 2 a longitudinal section through the target arrangement of FIG. 1 during the solder liquefaction;

FIG. 3 a longitudinal section through the target arrangement of FIG. 1 in a final assembly state;

FIG. 4 a cross-section through a target tube segment of the target arrangement of FIG. 1; and FIG. 5 a longitudinal section through a second embodiment of a target arrangement in accordance with the invention in a final assembly state.

Figure 6:
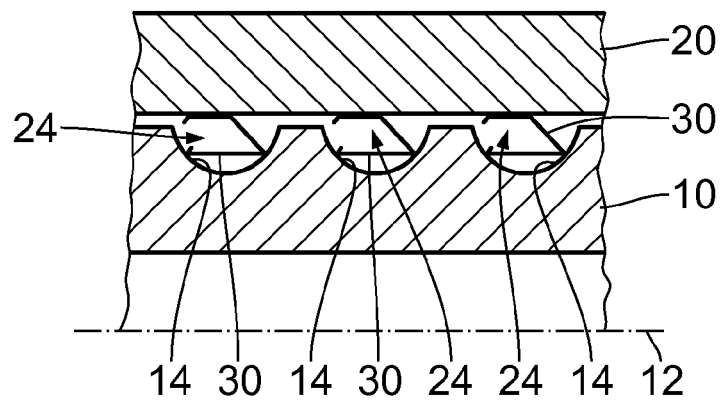

FIG. 6 a longitudinal section through a second embodiment of the target arrangement in accordance with the invention in a final assembly state.

The target arrangement in accordance with the invention shown in FIG. 1 includes a tubular carrier member 10 comprising a metal material such as titanium, steel, in particular stainless steel or copper. The chain-dotted line 12 represents the longitudinal central axis of the carrier member 10. The carrier member 10 is provided at its outer side with a solder layer, for example a layer of soldering tin.

Furthermore, at the outer side of the carrier element 10, a plurality of groove-like cut-outs 14 are introduced, for example milled or cut, into the carrier member 10. In the embodiment shown, the cut-outs 14 have a round and in particular an approximately semi-circular cross-section, but the cut-outs 14 can generally also have a round section which does not have the shape of a partial circle or can even have an angular cross-section.

Furthermore the cut-outs 14 in the embodiment shown extend transversely to the longitudinal central axis 12, i.e. in the peripheral direction of the carrier member 10, and indeed in each case along the total periphery of the carrier member 10. The cut-outs 14 are, in other words, made in the manner of ring grooves. Alternatively, a cut-out can also expand in the manner of a spiral, i.e. in the manner of a threaded groove, around the carrier member. Mixed forms are also conceivable in which, viewed in the axial direction, a plurality of cut-outs 14 are provided sectionally in the form of ring grooves or a cut-out in the manner of a threaded groove is provided.

As is shown in FIG. 1, the cut-outs 14 are spaced apart from one another such that a projection 16 is in each case formed by and lies between two adjacent cut-outs 14. In accordance with the configuration of the cut-outs 14, the projections 16 also extend along the total periphery of the carrier member 10 in the peripheral direction, i.e. transversely to the longitudinal central axis 12. In the case of a cut-out in the manner of a threaded groove, a projection would correspondingly extend around the carrier member in the manner of a spiral.

The spacings between adjacent cut-outs 14 are selected such that the projections 16 have a flattened plateau region 18 in each case at their outwardly facing upper sides 18. The width of the plateau region 18 can amount to approximately half the width of the cut-outs 14.

As is shown in FIG. 1, the target arrangement furthermore includes a hollow cylindrical target 20 comprising at least one tube segment 21 which is made in one piece and which comprises a target material, in particular a ceramic material such as ZnO.

Each tube segment 21 has a metal coating at its inner side, for example an electroplated coating 19 (FIG. 4). The coating comprises three sequential layers, namely an inner layer 19a of Ni, a middle layer 19b of Cu and an outer layer 19c of SnPb, with the middle layer 19b of Cu also being able to be omitted.

Each tube segment 21 surrounds the carrier member 10 at least section-wise. If the target 20 is composed of a plurality of tube segments 21, a respective heat resistant sealing material (not shown), e.g. a silicone material, is provided between two adjacent tube segments 21.

The inner diameter of each tube segment 21 is matched to the outer diameter of the carrier member 10 in the region of the projections 16 such that a gap 22 is formed between the plateau region 18 of each projection 16 and the inner side of the tube segment 21. In the non-heated state of the target arrangement, i.e. at room temperature for example, the gaps 22 can have a gap width which lies in the range of some tenths of a millimeter.

A plurality of plastically deformable compensation means are provided for the connection of the carrier element 10 and the target 20 and are formed in the embodiment shown in FIGS. 1 to 3 by a soft solder 24 which is free of flux and comprises e.g. SnIn or SnPb.

The soft solder 24 is introduced into the cut-outs 14, e.g. is inserted into the cut-outs 14 as half-stock, for the assembly of the target arrangement. Subsequently, the tube segment 21 or the tube segments 21 are pushed onto the carrier member 10 and positioned over the cut-outs 14 receiving the soft solder 24.

As is indicated in FIG. 1, the cut-outs 14, viewed in the axial direction, are arranged distributed over substantially the total length of the target 20. Fixing means, not shown, for example spring members, are arranged in those cut-outs 14 which are located in the region of the axial ends of the or each tube segment 21 for the fixing and centering of the target 20 with respect to the carrier member 10 in the pre-assembly state shown in FIG. 1.

The soft solder 24 present as half-stock in the cut-outs 14 is liquefied by means of a direct heat input 26 for the connection with material continuity of the target 20 to the carrier member 10, as is shown in FIG. 2. The heating of the soft solder 24 can take place, for example in a continuous furnace, from outside via the target 20 and/or from inside via the carrier member 10 by means of a heat source introducible into the carrier member 10.

On the melting of the soft solder 24, the carrier member 10 and the target 20 are also heated. The carrier member 10 and the target 20 expand to different degrees due to this heating, whereby the width of the gaps 22 between the projections 16 of the carrier member 10 and the tube segment 21 or the tube segments 21 is reduced, for example to a gap width of 0.05 mm to 0.1 mm.

In addition to the liquefaction of the soft solder 24, the carrier member 10 and the target 20 are set in rotation together around the longitudinal central axis 12. The rotation of the target arrangement is selected such that the liquefied soft solder 24 moves out of the cut-outs 14 onto the plateau regions 18 of the projections 16 and contracts in and at the gaps 22 due to centrifugal forces and capillary forces. It is prevented by the sealing material between adjacent tube segments 21 that melted solder 24 can reach the outer side of the target 20.

The heating and the rotation of the target arrangement are maintained for so long until so much solder 24 has collected in the gaps 22 that they are completely filled with solder 24. The solder 24 is now in contact both with the plateau regions 18 of the projections 16 of the carrier member 10 and with the target 20 and thus bridges the intermediate space between the target 20 and the carrier member 10.

The heat supply 26 is subsequently ended so that the target arrangement can cool down, preferably under continued rotation. The soft solder 24 solidifies due to this cooling down, with it simultaneously connecting to the target 20 and the carrier member 10 with material continuity.

The spacing between the target 20 and the carrier member 10 becomes larger again on the cooling of the target arrangement as a result of the different thermal expansions of the target 20 and the carrier member 10. As is shown in FIG. 3, the soft solder 24 located in the gaps 22 is drawn apart while forming solder bridges or solder fillets 28. Strains in the target 20 which could occur in the target 20 during the cooling due to the different thermal expansion of the joint partners 10, 20 and which could result in damage to the target 20 are avoided by the plastic deformability of the solder fillets 28.

The result is a target arrangement whose target 20 is connected with material continuity to the carrier member 10 via the plastically deformable solder fillets 28 of soft solder 24. A particularly good thermal coupling of the target 20 to the carrier member 10 is thereby achieved, on the one hand, and a reliable mechanical fastening of the target 20 to the carrier member 10, on the other hand, without there being a risk of damage to the target 20 due to strains which could result from the different thermal expansion of the joint partners.

In the second embodiment shown in FIG. 5, the target 20 made from one or more tube segments 21 and the carrier member 10 are not connected to one another by solder fillets 24. Instead, the different degrees of expansion of the carrier member 10 and the target 20 on the warming of the target arrangement, e.g. during a sputtering process, are compensated by spring members 30 which are arranged between the carrier member 10 and the tube segment 21 or the tube segments 21. The spring members 30 form the compensation means of this embodiment in that they are compressed on a heating of the target arrangement and expand again on a cooling of the target arrangement.

To ensure a particularly good heat transfer from the target 20 via the spring members 30 to the carrier member 10, the spring members 30 are connected with material continuity both to the tube segment 21 or to the tube segments 21 and to the carrier member 10.

A soft solder is provided as the connection means and is introduced between the spring members 30 and the tube segment 21 or tube segments 21 as well as between the spring members 30 and the carrier member 10. A connection with material continuity is in each case established between the spring members 30 and the carrier member 10 or the target 20 by a corresponding melting and cooling process.

As with the first embodiment described above, a metal coating 19, comprising a Ni layer 19a, an optional Cu layer 19b and a SnPb layer 19c, is also provided at the inner side of each tube segment 21 in the second embodiment (FIG. 4) to improve the connection with material continuity of the soft solder and the target 20. The carrier member 10 is accordingly provided at its outer side with a solder layer, for example a layer of soldering tin.

The fastening of the spring members 30 to the carrier member 10 can take place simultaneously with the fastening of the spring elements 30 to the target 20e.

In the embodiment shown in FIG. 6, the carrier element 10 and the target 20 are connected via spring members 30 located in cut-outs 14. The soft solder 24 connects the spring members 24 with the carrier element 10 and with the target 20.

Alternatively or additionally, the spring members 30 can also be connected with material continuity to the carrier member 10 before the pushing of the tube segment 21 or the tube segments 21 onto the carrier member 10. In this manner, the spring members 30 are already fixed to the carrier member 10 on the assembly of the target 20 and are secured against an axial displacement by the tube segment 21 or the tube segments 21. Alternatively or additionally, the spring members 30 can also be supported in cut-outs (not shown) of the carrier member 10 for this purpose.

REFERENCE NUMERAL LIST 10 carrier member
12 longitudinal central axis
14 cut-out
16 projection
18 plateau region
19 coating
20 target
22 gap
24 soft solder
26 heat input
28 solder fillet
30 spring member

The invention claimed is:

1. A target arrangement comprising a tubular carrier member (10) and a hollow cylindrical target (20) which comprises at least one target material and which includes at least one tube segment (21) made in one piece and surrounding the carrier member (10) at least section-wise, with the carrier member (10) and the tube segment (21) being partially connected to one another with material continuity by compensation means (24, 30),
characterized in that mutually spaced apart regions (22) of an intermediate space provided between the target (20) and the carrier member (10) are filled with the compensation means, wherein the compensation means comprise a spring member (30) and plastically deformable solder (24).

2. A target arrangement in accordance with claim 1, characterized in that the solder is a soft-solder.

3. A target arrangement in accordance with claim 1, characterized in that the solder (24) is provided between the target (20) and projections (16) of the carrier member (10).

4. A target arrangement in accordance with claim 3, characterized in that the projections (16) are spaced apart from one another, viewed in the axial or radial direction, and are arranged distributed over substantially the total length of the target (20), viewed in the radial or axial direction.

5. A target arrangement in accordance with claim 3, characterized in that the projections (16) comprise webs substantially extending in the peripheral direction of the carrier member (10).

6. A target arrangement in accordance with claim 3, the target arrangement comprising at least one of a plurality of web-shaped projections (16) that extend at right angles to the longitudinal axis (12) of the carrier member (10), and a web-shaped projection that extends in a spiral manner around the carrier member (10).

7. A target arrangement in accordance with claim 3, characterized in that cut-outs (14) of the carrier member (10) bounded by the projections (16) form a receiving space for the solder (24) in a pre-assembly state of the target arrangement.

8. A target arrangement in accordance with claim 1, characterized in that fixing means are arranged between the tube segment (21) and the carrier member (10) to fix the target (20) with respect to the carrier member (10) in a pre-assembly state.

9. A target arrangement in accordance with claim 1, characterized in that at least one of the tube segment (21) is metallized at its inner side or the carrier member (10) is metallized at its outer side.

10. A target arrangement in accordance with claim 1, characterized in that the compensation means (24, 30) are arranged in regions (22) axially spaced apart from one another between the tube segment (21) and the carrier member (10).

11. A target arrangement in accordance with claim 1, characterized in that that the compensation means (24, 30) are free of flux.

12. A target arrangement in accordance with claim 1, characterized in that a heat-resistant sealing material is provided between two adjacent tube segments (21).

13. A method for the manufacturing of a target arrangement comprising a tubular carrier member (10) and a hollow cylindrical target (20) which comprises at least one target material and which includes at least one tube segment (21) made in one piece and surrounding the carrier member (10) at least section-wise, in which method the carrier member (10) and the tube segment (21) are partially connected to one another with material continuity by compensation means (24, 30),
characterized in that mutually spaced apart regions (22) of an intermediate space provided between the target (20) and the carrier member (10) are filled with the compensation means, wherein the compensation means comprise a spring member (30) which is connected with material continuity to the carrier member (10) and to the target (20) by plastically deformable solder (24).

14. A method in accordance with claim 13, characterized in that the solder (24) is arranged between projections (16) of the carrier member (10) spaced apart from one another in a pre-assembly state of the target arrangement.

15. A method in accordance with claim 13, characterized in that the solder (24) is liquefied by a direct heat input (26) and the target (20) and the carrier member (10) are rotated such that the liquefied solder (24) moves under the effect of centrifugal forces and capillary forces to connect with material continuity the spring member (30) to the carrier member (10) and the target (20).

16. A method in accordance with claim 13, characterized in that at least one of the tube segment (21) is metallized at its inner side or the carrier member (10) is metallized at its outer side before the application of the solder (24).

17. A target arrangement in accordance with claim 8, characterized in that fixing means are arranged between the tube segment (21) and the carrier member (10) to center the target (20) with respect to the carrier member (10) in a pre assembly state.

18. A target arrangement in accordance with claim 9, characterized in that at least one of the tube segment (21) is solder coated over the full area at its inner side or the carrier member (10) is solder coated over the full area at its outer side.

19. A target arrangement in accordance with claim 12, characterized in that a silicon material as heat-resistant sealing material is provided between two adjacent tube segments (21).

20. A method in accordance with claim 18, characterized in that the solder (24) is a soft-solder free of flux.

21. A method in accordance with claim 16, characterized in that at least one of the tube segment (21) is solder plated over the full area at its inner side or the carrier member (10) is solder plated over the full area at its outer side before the application of the solder (24).

22. A target arrangement in accordance with claim 1, wherein the spring member (30) is connected to the carrier member (10) and to the tube segment (21) with material continuity by means of a solder.

* * * * *

UNITED STATES PATENT AND TRADEMARK OFFICE
CERTIFICATE OF CORRECTION

PATENT NO. : 8,663,438 B2
APPLICATION NO. : 12/281310
DATED : March 4, 2014
INVENTOR(S) : Grit Huttl, Folke Steinert and Joachim Wagner It is certified that error appears in the above-identified patent and that said Letters Patent is hereby corrected as shown below:

On the title page, next to the word "Assignee:" delete "GFE" and insert -- GfE --

In the Claims

Column 10 line 6 in claim 6, delete "of" and insert -- of: --

Column 10 line 30 in claim 11, delete the additional word "that"

Column 11 line 2 in claim 17, delete the word "pre assembly" and insert -- pre-assembly --

Column 11 line 12 in claim 20, delete the word "method" and insert -- target arrangement --

Signed and Sealed this
Twenty-fourth Day of June, 2014

Michelle K. Lee
*Deputy Director of the United States Patent and Trademark Office*